United States Patent
Kim

(10) Patent No.: US 10,423,052 B2
(45) Date of Patent: Sep. 24, 2019

(54) CAMERA MODULE INCLUDING A THERMOELECTRIC ELEMENT FOR INHIBITING FROSTING OR OVERHEATING

(71) Applicant: LG Innotek Co., Ltd., Seoul (KR)

(72) Inventor: Dae Hwan Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/741,136

(22) PCT Filed: Jun. 30, 2016

(86) PCT No.: PCT/KR2016/007008
§ 371 (c)(1),
(2) Date: Dec. 29, 2017

(87) PCT Pub. No.: WO2017/003201
PCT Pub. Date: Jan. 5, 2017

(65) Prior Publication Data
US 2018/0188636 A1    Jul. 5, 2018

(30) Foreign Application Priority Data
Jul. 1, 2015   (KR) .......... 10-2015-0093866

(51) Int. Cl.
| H04N 5/225 | (2006.01) |
| G03B 17/55 | (2006.01) |
| G02B 7/02  | (2006.01) |
| H01L 35/08 | (2006.01) |
| H01L 35/32 | (2006.01) |

(52) U.S. Cl.
CPC ............ G03B 17/55 (2013.01); G02B 7/028 (2013.01); H01L 35/08 (2013.01); H01L 35/32 (2013.01); *H04N 5/2253* (2013.01); *H04N 5/2254* (2013.01)

(58) Field of Classification Search
CPC ......... G03B 17/55; H01L 35/08; H01L 35/32; G02B 7/028; H04N 5/2254; H04N 5/2253
See application file for complete search history.

(56) References Cited

U.S. PATENT DOCUMENTS

| 8,438,862 B2 * | 5/2013 | Oman ............... H05K 7/20854 |
| | | 165/202 |
| 2007/0109441 A1 | 5/2007 | Cheng |

FOREIGN PATENT DOCUMENTS

| JP | 2008-116803 A    | 5/2008 |
| KR | 10-0950386 B1    | 3/2010 |
| KR | 10-2011-0068442 A | 6/2011 |
| KR | 10-2014-0076408 A | 6/2014 |

OTHER PUBLICATIONS

International Search Report in International Application No. PCT/KR2016/007008, filed Jun. 30, 2016.

* cited by examiner

*Primary Examiner* — Padma Haliyur
(74) *Attorney, Agent, or Firm* — Saliwanchik, Lloyd & Eisenschenk

(57) ABSTRACT

One embodiment of a camera module can comprise: a lens unit; a holder coupled to the lens unit; a cover member arranged on the top of the holder, and encompassing the lens unit; an image sensing unit arranged on the lower part of the lens unit and the holder; and a thermoelement formed in a hollow shape and encompassing the lens unit, and arranged such that one surface thereof faces the image sensing unit.

17 Claims, 5 Drawing Sheets

CAMERA MODULE INCLUDING A THERMOELECTRIC ELEMENT FOR INHIBITING FROSTING OR OVERHEATING

CROSS-REFERENCE TO RELATED APPLICATIONS

This application is the U.S. national stage application of International Patent Application No. PCT/KR2016/007008, filed Jun. 30, 2016, which claims priority to Korean Application No. 10-2015-0093866, filed Jul. 1, 2015, the disclosures of each of which are incorporated herein by reference in their entirety.

TECHNICAL FIELD

Embodiments relate to a camera module having a structure which may prevent a lens unit from being frosted and prevent parts, such as an image sensing unit, from overheating.

BACKGROUND ART

Contents which will be described hereinafter do not constitute conventional technology and serve simply to provide background information of embodiments.

Camera modules may be used in various fields. For example, camera modules may be used in an anti-crime CCTV, a black box for vehicles, a rear camera used in parking of a vehicle, etc.

Camera modules for crime prevention, vehicles, etc. may be used outdoors. Therefore, at least some of parts of such a camera module may be exposed to the outside. Particularly, among parts of the camera module, a lens unit is exposed to the outside so as to photograph a subject and may thus be sensitive to the surrounding environment.

Particularly, if a surrounding temperature is lowered to below the freezing point, an exposed portion of the lens unit may be covered with frost and such frost obstructs incidence of light on the lens unit and may thus cause malfunction of the camera module or blur or distort an image picked up.

Further, when the camera module is operated, parts in the camera module may be heated. Particularly, among the parts, if an image sensing unit on which an image of the subject is formed overheats, image distortion may occur due to performance degradation and malfunction of the image sensing unit. Therefore, improvement in the camera module is required.

DISCLOSURE

Technical Problem

Embodiments provide a camera module which may prevent a lens unit from being frosted and prevent parts, such as an image sensing unit, from overheating.

Technical objects of embodiments are not limited to the above-described objects, and additional advantages, objects, and features of the embodiments will be set forth in part in the description which follows and in part will become apparent to those having ordinary skill in the art upon examination of the following or may be learned from practice of the embodiments.

Technical Solution

In one embodiment, a camera module includes a lens unit, a holder coupled to the lens unit, a cover member arranged on an upper end of the holder and encompassing the lens unit, an image sensing unit arranged under the lens unit and the holder, and a thermoelectric element formed in a hollow shape, encompassing the lens unit, and arranged such that one surface thereof faces the image sensing unit.

In another embodiment, a camera module includes a lens unit, a holder coupled to the lens unit, a cover member arranged on an upper end of the holder and encompassing the lens unit, an image sensing unit arranged under the lens unit and the holder, a thermoelectric element formed in a hollow shape, encompassing the lens unit, and arranged such that a lower surface thereof faces the image sensing unit, a portion of the thermoelectric element adjacent to an upper portion of the lens unit being heated and a portion of the thermoelectric element adjacent to the image sensing unit being cooled, and a packing member arranged between the holder and the thermoelectric element.

Advantageous Effects

A thermoelectric element in accordance with one embodiment may heat the upper portion of a lens unit, i.e., a portion of the lent unit exposed to the outside, and thus remove frost from the exposed portion, and cool an image sensing unit and thus prevent occurrence of failure due to overheating of the image sensing unit.

Therefore, the thermoelectric element removes frost from the exposed portion of the lens unit and prevents the image sensing unit from overheating, thus being capable of preventing performance degradation and failure of a camera module due to frosting and overheating of the thermoelectric element.

BEST MODE

Figure 1:
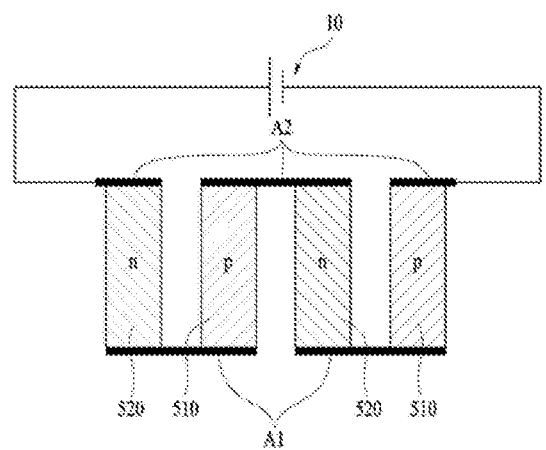
FIG. 1 is a view illustrating operation of a thermoelectric element in accordance with one embodiment.

Hereinafter, embodiments will be described with reference to the annexed drawings and description. However, the embodiments set forth herein may be variously modified, and it should be understood that there is no intent to limit the disclosure to the particular forms disclosed, but on the contrary, the embodiments are to cover all modifications, equivalents, and alternatives falling within the spirit and scope of the disclosure as defined by the claims. Sizes or shapes of elements illustrated in the drawings may be exaggerated for clarity and convenience of description.

It will be understood that, although terms "first", "second", etc. may be used herein to describe various elements, these terms do not limit the elements. These terms are used only to discriminate one substance or element from other substances or elements. Further, terms specially defined in consideration of the configurations and functions of the embodiments serve only to describe the embodiments and do not limit the scope of the disclosure.

In the following description of the embodiments, it will be understood that, when each element is referred to as being formed "on" or "under" another element, it can be directly "on" or "under" the other element or be indirectly formed with one or more intervening elements therebetween. Further, when an element is referred to as being formed "on" or "under" another element, not only the upward direction of the former element but also the downward direction of the former element may be included.

In addition, it will be understood that, although relational terms "on/above/upper", "under/below/lower", etc. may be used herein to describe various elements, these terms neither necessarily require nor connote any physical or logical relations between substances or elements or the order thereof, and are used only to discriminate one substance or element from other substances or elements.

Further, in the drawings, a rectangular coordinate system (x, y, z) may be used. In the drawings, the x-axis and the y-axis define a plane which is parallel to an optical axis and, for convenience, a direction (the z-axis direction) which is parallel to the optical axis may be referred to as a first direction, the x-axis direction may be referred to as a second direction, and the y-axis direction may be referred to as a third direction.

FIG. 1 is a view illustrating operation of a thermoelectric element 500 in accordance with one embodiment. The thermoelectric element 500 may include p-type semiconductors 510 and n-type semiconductors 520 and connectors to connect the same. The connectors may include first connectors A1, each of which connects one end of the p-type semiconductor 510 and one end of the n-type semiconductor 520, and second connectors A2, each of which connects the other end of the p-type semiconductor 510 and the other end of the n-type semiconductor 520.

In the thermoelectric element 500, as exemplarily shown in FIG. 1, the p-type semiconductors 510 and the n-type semiconductors 520 may be alternately arranged. Ends of the neighboring p-type semiconductor 510 and n-type semiconductor 520 may be conductively connected by the first connector A1, and the other ends of the neighboring p-type semiconductor 510 and n-type semiconductor 520 may be conductively connected by the second connector A2.

Here, the p-type semiconductors 510 and the n-type semiconductors 520 may be connected in series and receive DC from a DC power source 10. When DC is applied to the thermoelectric element 500, one of the first connectors A1 and the second connectors A2 may be heated and the other may be cooled. Here, the heated connectors and the cooled connectors may be adjusted by changing the direction of DC.

Such a heating and cooling effect is referred as the Peltier effect, and the thermoelectric element 500 may be heated and cooled by the Peltier effect using DC applied thereto. In accordance with one embodiment, a portion of a camera module may be heated and the other portion of the camera module may be cooled using the thermoelectric element 500.

Here, the first connectors A1 and the second connectors A2 may be formed in a plate shape so as to effectively achieve heat transfer from an adjacent target object requiring cooling or heat transfer to an adjacent target object requiring heating.

Figure 2:
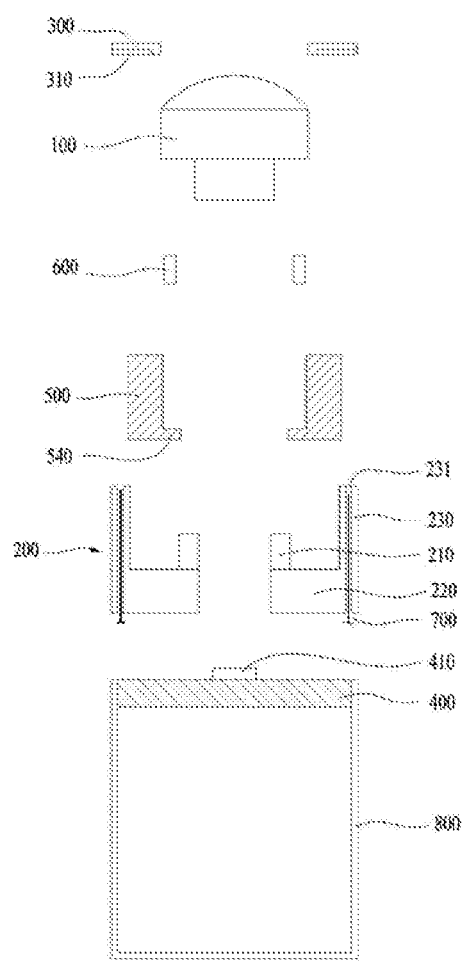
FIG. 2 is an exploded view illustrating a camera module in accordance with one embodiment.
Figure 3:
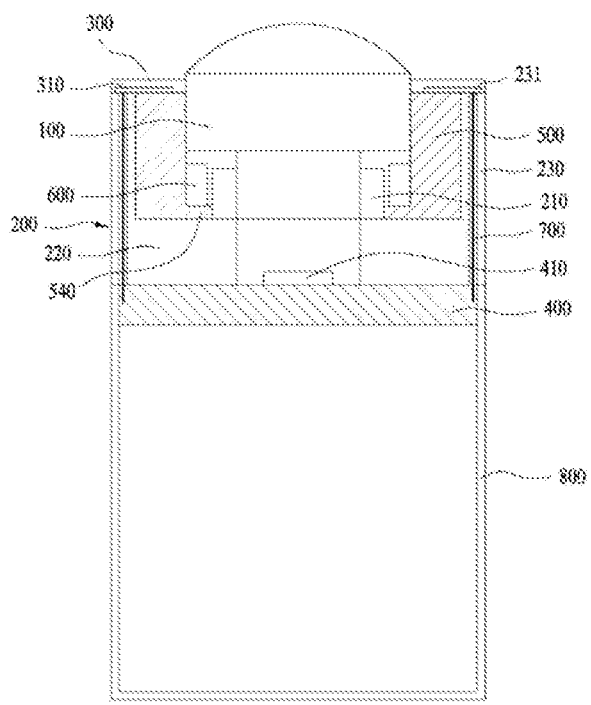
FIG. 3 is a cross-sectional view illustrating the camera module in accordance with the embodiment.

FIG. 2 is an exploded view illustrating a camera module in accordance with one embodiment. FIG. 3 is a cross-sectional view illustrating the camera module in accordance with the embodiment. Although not shown in the drawings, as seen from the first direction which is parallel to the optical axis direction of light incident on a lens unit 100, the camera module generally has a rectangular shape. FIGS. 2 and 3 are cross-section views of the camera module, taken along a diagonal line for clarity of description.

The camera module in accordance with this embodiment may include the lens unit 100, a holder 200, a lens coupling unit 210, a cover member 300, an image sensing unit 400, a thermoelectric element 500, a packing member 600, cables 700, and a casing 800.

The lens unit 100 may include at least one lens, or include a plurality of lenses arranged in the optical axis direction of incident light so as to form an optical system. Further, a portion of the lens unit 100 may be exposed to the outside and thus be influenced by the surrounding environment.

Particularly, if a surrounding temperature is below the freezing point, the exposed portion of the lens unit 100 may be covered with frost and such frost obstructs incidence of light on the lens unit 100 and may thus cause malfunction of the camera module or blur or distort an image picked up.

Further, in this embodiment, in order to prevent the exposed portion of the lens unit 100 from being covered with frost, the exposed portion of the lens unit 100, i.e., an upper portion of a lens in FIG. 3, is heated using the thermoelectric element 500.

The holder 200 may be coupled to the lens unit 100, serve to fix the lens unit 100, and include the lens coupling unit 210, a first support part 220 and a second support part 230.

A lower portion of the lens unit 100 may be coupled to the lens coupling unit 210. In more detail, the lens coupling unit 210 may be formed in a hollow shape and a lower portion of the lens may be coupled to the inner circumferential surface of a hollow of the lens coupling unit 210.

Here, for example, a female screw may be formed on the outer circumferential surface of the lower portion of the lens unit 100, a male screw may be formed on the inner circumferential surface of the lens coupling unit 210, and the lens unit 100 and the lens coupling unit 210 may be coupled to each other by a screw coupling method.

In accordance with another embodiment, no screw may be formed on the outer circumferential surface of the lower portion of the lens unit 100 and the inner circumferential surface of the lens coupling unit 210, and the lens unit 100 and the lens coupling unit 210 may be coupled to each other by an adhesive.

The outer circumferential surface of the lens coupling unit 210 may serve to support a small diameter part 540 formed at the lower portion of the thermoelectric element 500 formed in a hollow shape.

The first support part 220 may be formed at the lower portion of the holder 200 and serve to support the lower portion of the thermoelectric element 500, and the second support part 230 may be formed at the side portion of the holder 200 and serve to support the side portion of the thermoelectric element 500. Therefore, the thermoelectric element 500 may be supported by the first support part 220 and the second support part 230 and the lens coupling part 210 and thus be seated on the holder 200.

Further, the first support part 220 and the second support part 230 of the holder 200 form the external appearance of the holder 200 and may thus serve to protect the thermoelectric element 500, the packing member 600 and the lens unit 100 received in the holder 200 from external impact, etc. and to prevent foreign substances from being introduced into the thermoelectric element 500.

A pair of through holes 231 may be formed through the second support part 230. The through holes 231 may pass through the second support part 230 in the vertical direction, and the cables 700 to conductively connect the thermoelectric element 500 and the image sensing unit 400 may be inserted into the through holes 231.

One end of the cable 700 may be connected to a pattern electrode 310 and the other end of the cable 700 may be connected to the image sensing unit 400. As exemplarily shown in FIG. 3, a pair of the cables 700 may be provided and be inserted into a pair of the through holes 231.

Here, an upper end of the cable 700 may be connected to the pattern electrode 310 formed on the lower surface of the cover member 300, and a lower end of the cable 700 may be connected to the image sensing unit 400. Here, the cables 700 may be soldered to the pattern electrode 310 and the image sensing unit 400 or be adhered to the pattern electrode 310 and the image sensing unit 400 by a conductive adhesive, thus being conductively connected to the pattern electrode 310 and the image sensing unit 400.

The image sensing unit 400 may be connected to an external power source and thus receive current applied therefrom. Since current applied to the image sensing unit 400 flows along the cables 700 and the pattern electrode 310 and the pattern electrode 310 is connected to the thermoelectric element 500, the current applied to the image sensing unit 400 may be supplied to the thermoelectric element 500.

Here, DC flows in the thermoelectric element 50, as described above, and, thus, if the external power source supplies AC, a rectifier, etc. which are installed in the camera module to convert AC into DC, are required.

The image sensing unit 400 may be arranged under the lens unit 100 and the holder 200 such that one surface of the image sensing unit 400 faces one surface of the thermoelectric element 500. That is, as exemplarily shown in FIG. 2, the image sensing unit 400 may be arranged such that the upper surface of the image sensing unit 400 faces the lower surface of the thermoelectric element 500.

Here, the lower portion of the thermoelectric element 500 may be cooled, and this will be described later. Therefore, the image sensing unit 400 provided under the thermoelectric element 500 may be cooled. When the camera module is operated, particularly, the image sensing unit 400 may be heated, thus causing malfunction, deformation or damage of the image sensor unit 400 due to heating of the image sensing unit 400.

In accordance with this embodiment, in order to prevent failure or performance degradation of the camera module due to malfunction, deformation or damage of the image sensing unit 400, the image sensing unit 400 is cooled using the cooled portion of the thermoelectric element 500.

In order to effectively cool the image sensing unit 400, through holes may be formed through the first support part 220 of the holder 200 so as to increase heat transfer. In accordance with another embodiment, the first support part 200 may be provided with a heat transfer member formed of a material having high thermal conductivity, for example, copper or a copper alloy.

The holder 200 including the first support part 220 provided with the heat transfer member may be manufactured by, for example, insert injection molding. Here, the heat transfer member may be provided such that the upper surface of the heat transfer member contacts or faces the lower portion of the thermoelectric element 500 and the lower surface of the heat transfer member contacts or faces an image sensor 410.

Further, the image sensing unit 400 may be provided with the image sensor 410. The image sensor 410 may be provided at a region corresponding to the lens unit 100, on the upper surface of the image sensing unit 400. Therefore, the image sensor 410 is irradiated with light incident through the lens unit 100 and, thus, an image of a subject is formed on the image sensor 410.

The image sensing unit 400 may include, for example, a printed circuit board and, thus, with various circuit elements to transmit an image signal formed by the image sensor 410 to other devices or parts or to receive power supplied from the external power source may be formed or provided on the image sensing unit 400.

The packing member 600 may be provided in a ring shape between the outer circumferential surface of the lens coupling unit 210 and the inner circumferential surface of the thermoelectric element 500, and serve to pack a gap between the inner circumferential surface of the thermoelectric element 500 and the outer circumferential surface of the lens coupling unit 210 of the holder 200.

The packing member 600 may serve to prevent foreign substances from being introduced into the image sensing unit 400 and the casing 800 receiving the image sensing unit 400 through the gap between the inner circumferential surface of the thermoelectric element 500 and the outer circumferential surface of the lens coupling unit 210.

Such a packing member 600 may include, for example, an O-ring, and the O-ring may be formed of any material having an excellent packing effect, such as metal, plastic, a flexible polymer, etc.

The cover member 300 may be arranged at the upper end of the holder 200 so as to encompass the lens unit 100. The cover member 300 may be coupled with the holder 200 by an adhesive or coupling units, such as screws, coupling pins, etc. If the cover member 300 is coupled with the holder 200 by coupling units, holes or grooves, into which the coupling units are inserted, may be formed on the cover member 300 and the holder 200.

The pattern electrode 310 conductively connected to the thermoelectric element 500 may be formed on the lower surface of the cover member 300. The pattern electrode 310 is formed so as to conductively connect the thermoelectric element 500 and the image sensing unit 400 to each other, and a detailed structure of the pattern electrode 310 will be described in detail later with reference to FIG. 6.

The casing 800 may be coupled with the holder 200 and serve to receive the image sensing unit 400. The casing 800 and the holder 200 may be coupled by coupling units, or coupled through a shape fitting method or an interference fitting method.

Although not shown in the drawings, in addition to the image sensing unit 400, a plurality of printed circuit boards may be received in the casing 800. A power supply device, a condenser, an image processing device, a circuit pattern and various other elements to operate the camera module may be arranged or formed on the printed circuit boards.

The thermoelectric element 500 may be formed in a hollow shape, encompass the lens unit 100, and be arranged such that one surface of the thermoelectric element 500 faces the image sensing unit 400. With reference to FIG. 3, the thermoelectric element 500 may be provided such that the upper portion of the thermoelectric element 500, i.e., a portion thereof adjacent to the upper portion of the lens unit 100, is heated and the lower portion of the thermoelectric element 500, i.e., a portion thereof adjacent to the image sensing unit 400, is cooled.

As described above, the cooling portion and the heating portion may be determined by adjusting the direction of DC applied to the thermoelectric element 500. The thermoelectric element 500 heats the upper portion of the lens unit 100, i.e., a portion of the lens unit 100 exposed to the outside, and may thus remove frost from the exposed portion, and cools the image sensing unit 400 and may thus prevent occurrence of failure due to overheating of the image sensing unit 400.

Figure 4:
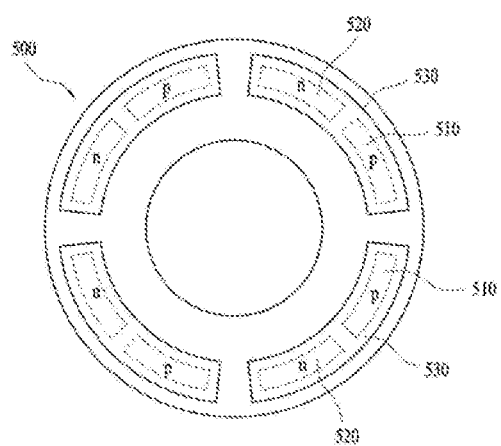
FIG. 4 is a bottom view illustrating the thermoelectric element in accordance with the embodiment.
Figure 5:
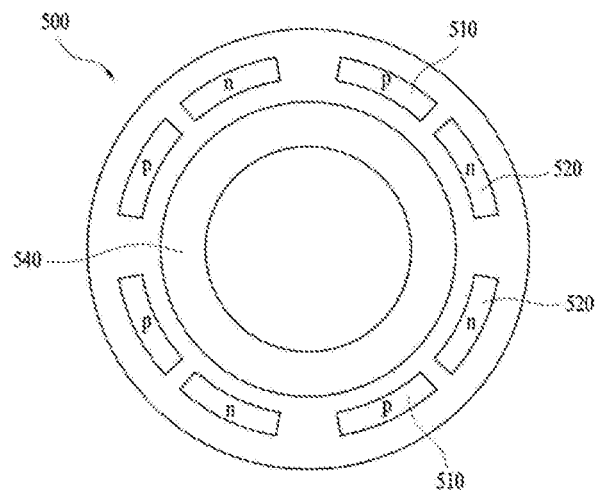
FIG. 5 is a plan view illustrating the thermoelectric element in accordance with the embodiment.

FIG. 4 is a bottom view illustrating the thermoelectric element 500 in accordance with the embodiment, and FIG. 5 is a plan view illustrating the thermoelectric element 500 in accordance with the embodiment. As exemplarily shown in FIGS. 4 and 5, the thermoelectric element 500 may be formed in a ring shape having a hollow formed therein, as seen from the first direction which is parallel to the optical axis direction.

Here, in order to achieve stable support by the first support part 220 of the holder 200 and to support the lower portion of the packing member 600, the small diameter part 540 having a smaller hollow diameter than that of an upper portion of the thermoelectric element 500 may be formed at the lower portion of the thermoelectric element 500. However, the small diameter part 540 is not essential and the thermoelectric element 500 excluding the small diameter part 540 may be provided.

In the thermoelectric element 500, the p-type semiconductors 510 and the n-type semiconductors 520 may be alternately arranged in at least one section in a circumferential direction of the thermoelectric element 500. With reference to FIGS. 4 and 5, the p-type semiconductors 510 and the n-type semiconductors 520 may be alternately arranged in upper and lower regions in these figures, and an arrangement state of the p-type semiconductors 510 and the n-type semiconductors 520 in the upper region and an arrangement state of the p-type semiconductors 510 and the n-type semiconductors 520 in the lower region are symmetrical to each other.

As exemplarily shown in FIG. 4, the p-type semiconductor 510 and the n-type semiconductor 520 which are adjacent to each other may be connected by a first connector 530 on the lower surface of the thermoelectric element 500. Further, the p-type semiconductor 510 and the n-type semiconductor 520 which are adjacent to each other but are not connected by the first connector 530 may be connected by a second connector 312 of the pattern electrode 310 on the upper surface of the thermoelectric element 500, and this will be described later with reference to FIG. 7.

Owing to such a structure, with reference to FIG. 4, the p-type semiconductors 510 and the n-type semiconductors 520 arranged in each of the upper and lower regions in these figures may be connected in series, as described above with reference to FIG. 1.

The lower portion of the thermoelectric element 500 is cooled, as described above and, in more detail, the first connectors 530 connecting the lower ends of the p-type semiconductors 510 and the n-type semiconductors 520 may be cooled. On the other hand, the upper portion of the thermoelectric element 500 is heated and, in more detail, the pattern electrode 310 connecting the upper ends of the p-type semiconductors 510 and the n-type semiconductors 520 may be heated.

The first connectors 530 may be coupled to the p-type semiconductors 510 and the n-type semiconductors 520 by soldering or an adhesive method using a conductive adhesive. Of course, the first connectors 530 may be formed of a conductive material.

As exemplarily shown in FIG. 5, the upper ends of the p-type semiconductors 510 and the n-type semiconductors 520 may be exposed from the upper surface of the thermoelectric element 500. The exposed upper ends of the p-type semiconductors 510 and the n-type semiconductors 520 may be connected by the second connectors 312.

Figure 6:
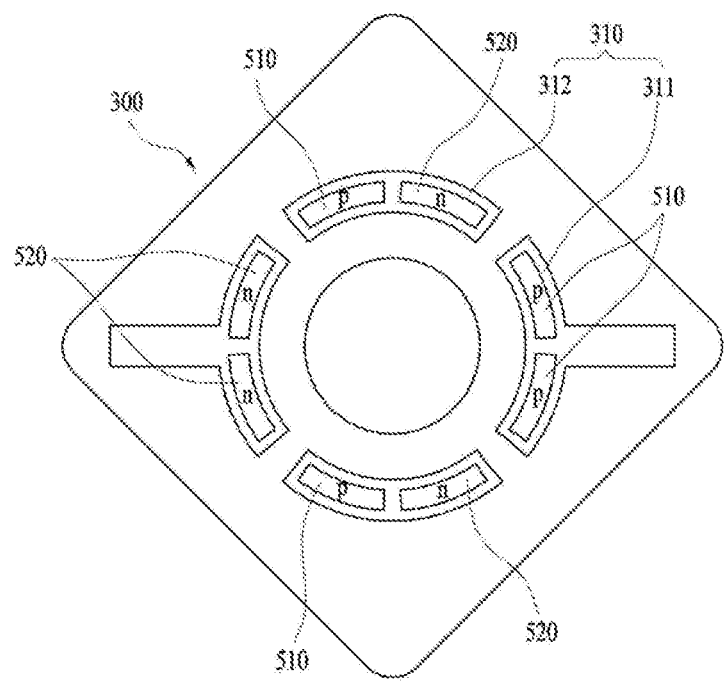
FIG. 6 is a bottom view illustrating a cover member in accordance with the embodiment.

FIG. 6 is a bottom view illustrating the cover member 300 in accordance with the embodiment. For clarity of description, FIG. 6 illustrates a state in which the p-type semiconductors 510 and the n-type semiconductors 520 of the thermoelectric element 500 are coupled to the pattern electrode 310.

The pattern electrode 310 may be formed on the cover member 300. The pattern electrode 310 may be formed in, for example, a plate shape, and be coupled to the lower surface of the cover member 300 by an adhesive. In accordance with another embodiment, the pattern electrode 130 may be formed on the cover member 300 by a method, such as etching or insert injection molding.

The pattern electrode 310 may include terminals 311 and the second connectors 312. The terminals 311 may be connected to the cables 700, connect semiconductors of the same kind, and receive DC applied through the cables 700.

The terminal 311 may connect semiconductors of the same kind, i.e., the p-type semiconductor 510 and the p-type semiconductor 510 or the n-type semiconductor 520 and the n-type semiconductor 520. With reference to FIG. 6, the p-type semiconductors 510 and the n-type semiconductors 520 alternately arranged in each of the upper and lower regions of this figure may be connected by the first connectors 530 at the lower end of the thermoelectric element 500 and be connected by the second connectors 312 at the upper end of the thermoelectric element 500. Therefore, the p-type semiconductors 510 and the n-type semiconductors 520 of the thermoelectric element 500 may be arranged so as to be connected in series in each of the upper and lower region of this figure.

The terminals 311 are provided at left and right sides of this figure, the left terminal 311 may connect the n-type semiconductor 520 and the n-type semiconductor 520, and the right terminal 311 may connect the p-type semiconductor 510 and the p-type semiconductor 510.

Therefore, the terminals 311 may connect two serial connection structures of the p-type semiconductor 510 and the n-type semiconductor 520, arranged in each of the upper and lower region of this figure, in parallel and receive DC. DC applied through the terminals 311 may be supplied to the thermoelectric element 500.

Further, as exemplarily shown in FIG. 6, the terminal 311 may include a protrusion protruding in the direction of a corner of the cover member 300, and the protrusion may be connected to the cable 700. The protrusion and the cable 700 may be conductively connected by soldering or an adhesive method using a conductive adhesive.

The second connectors 312 may be arranged so as to be separated from the terminals 311, and each of the second connectors 312 may connect the p-type semiconductor 510 and the n-type semiconductor 520. That is, the second connector 312 may connect the p-type semiconductor 510 and the n-type semiconductor 520 in series at the upper end of the thermoelectric element 500.

When the cover member 300 is coupled to the holder 200, the pattern electrode 310 contacts the upper ends of the p-type semiconductors 510 and the n-type semiconductors 520 exposed from the upper end of the thermoelectric element 500 by applied pressure and may thus connect the p-type semiconductors 510 and the n-type semiconductors 520 in series or in parallel.

Further, in order to firmly conductively connect the pattern electrode 310 to the p-type semiconductors 510 and the n-type semiconductors 520, the pattern electrode 310 may be adhered to the upper ends of the p-type semiconductors 510 and the n-type semiconductors 520 using a conductive adhesive.

Figure 7:
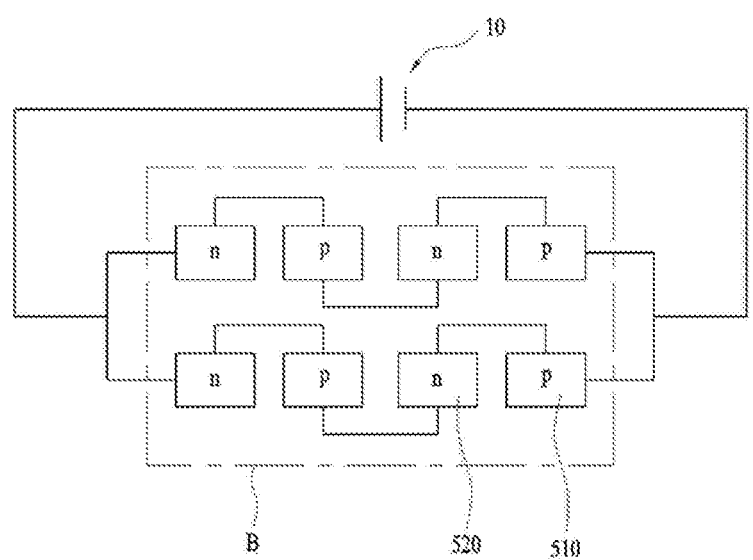
FIG. 7 is a view illustrating a conductive connection state of the thermoelectric element in accordance with the embodiment.

FIG. 7 is a view illustrating a conductive connection state of the thermoelectric element 500 in accordance with the embodiment.

The thermoelectric element 500 may receive DC applied by the DC power source 10 and the p-type semiconductors 510 and the n-type semiconductors 520 may be connected in series. The p-type semiconductors 510 and the n-type semiconductors 520 connected in series may be provided in plural and form a serial connection section B.

Further, both ends of the serial connection section B may be connected to the DC power source 10 in parallel. Therefore, one end of each of the p-type semiconductors 510 and the n-type semiconductors 520 connected in series in the serial connection section B may be heated, and the other end of each of the p-type semiconductors 510 and the n-type semiconductors 520 may be cooled.

FIG. 7 illustrates a conductive connection structure of the thermoelectric element 500 shown in FIGS. 4 to 6 in brief, connected to the DC power source 10. Of course, the DC power source 10 may be implemented through a camera module in accordance with one embodiment and an external power source connected thereto.

The p-type semiconductors 510 and the n-type semiconductors 520 provided in the serial connection section B indicates the p-type semiconductors 510 and the n-type semiconductors 520 alternately arranged in the circumferential direction in FIGS. 4 and 5.

In accordance with this embodiment, the thermoelectric element 500 removes frost from an exposed portion of the lens unit 100 and prevents the image sensing unit 400 from overheating, thus being capable of preventing performance degradation and failure of a camera module due to frosting and overheating of the thermoelectric element.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims.

INDUSTRIAL APPLICABILITY

A thermoelectric element in accordance with one embodiment may heat the upper portion of a lens unit, i.e., a portion of the lent unit exposed to the outside, and thus remove frost from the exposed portion, and cool an image sensing unit and thus prevent occurrence of failure due to overheating of the image sensing unit. Therefore, the thermoelectric element is industrially applicable.

The invention claimed is:
1. A camera module comprising:
a lens unit;
a holder coupled to the lens unit;
a cover member disposed on an upper end of the holder and encompassing the lens unit;
an image sensing unit disposed under the lens unit and the holder; and
a thermoelectric element formed in a hollow shape, encompassing the lens unit, and disposed such that one surface thereof faces the image sensing unit;
wherein the holder comprises:
a lens coupling unit coupled to a lower portion of the lens unit;
a first support part supporting a lower portion of the thermoelectric element; and
a second support part supporting a side portion of the thermoelectric element;
wherein a pattern electrode conductively connected to the thermoelectric element is formed on a lower surface of the cover member; and
wherein a pair of through holes is formed through the second support part such that a pair of cables is inserted into the pair of through holes, respectively.

2. The camera module according to claim 1, wherein the lens coupling unit is formed in a hollow shape, the lower portion of the lens unit being coupled to an inner circumferential surface of the lens coupling unit.

3. The camera module according to claim 1, further comprising a packing member provided between an outer circumferential surface of the lens coupling unit and an inner circumferential surface of the thermoelectric element.

4. The camera module according to claim 3, wherein the packing member is an O-ring.

5. The camera module according to claim 1, wherein one end of each of the cables is connected to the pattern electrode, and the other end of each of the cables is connected to the image sensing unit.

6. The camera module according to claim 5, wherein the pattern electrode comprises terminals connected to the cables, connecting semiconductors of the same kind and receiving DC applied thereto.

7. The camera module according to claim 6, wherein the pattern electrode further comprises second connectors disposed so as to be separated from the terminals and connecting p-type semiconductors and n-type semiconductors.

8. The camera module according to claim 1, wherein the thermoelectric element is formed in a ring shape, as seen from a first direction being in parallel to an optical axis direction.

9. The camera module according to claim 8, wherein the thermoelectric element is configured such that p-type semiconductors and n-type semiconductors are alternately disposed in at least a section of the thermoelectric element in a circumferential direction of the thermoelectric element, and the p-type semiconductors and the n-type semiconductors are connected in series.

10. The camera module according to claim 1, wherein a portion of the thermoelectric element adjacent to an upper portion of the lens unit is heated.

11. The camera module according to claim 10, wherein another portion of the thermoelectric element adjacent to the image sensing unit is cooled.

12. The camera module according to claim 1, wherein the thermoelectric element heats an upper portion of the lens unit.

13. The camera module according to claim 12, wherein the thermoelectric element cools the image sensing unit.

14. A camera module comprising:
a lens unit;
a holder coupled to the lens unit;

a cover member disposed on an upper end of the holder and encompassing the lens unit;

an image sensing unit disposed under the lens unit and the holder;

a thermoelectric element formed in a hollow shape, encompassing the lens unit, and disposed such that a lower surface thereof faces the image sensing unit, a portion of the thermoelectric element adjacent to an upper portion of the lens unit being heated and another portion of the thermoelectric element adjacent to the image sensing unit being cooled; and a packing member disposed between the holder and the thermoelectric element;

wherein the holder comprises:

a lens coupling unit coupled to a lower portion of the lens unit;

a first support part supporting a lower portion of the thermoelectric element; and a second support part supporting a side portion of the thermoelectric element;

wherein a pattern electrode conductively connected to the thermoelectric element is formed on a lower surface of the cover member; and wherein a pair of through holes is formed through the second support part such that a pair of cables is inserted into the pair of through holes.

15. The camera module according to claim 14, wherein the thermoelectric element comprises p-type semiconductors and n-type semiconductors connected in series, and DC is applied to the thermoelectric element.

16. The camera module according to claim 15, wherein first connectors to connect the p-type semiconductors and the n-type semiconductors are provided on a lower surface of the thermoelectric element.

17. A camera module comprising:

a lens unit;

a holder coupled to the lens unit;

a cover member disposed on an upper end of the holder and encompassing the lens unit;

an image sensing unit disposed under the lens unit and the holder;

a thermoelectric element formed in a hollow shape, encompassing the lens unit, and disposed such that a lower surface thereof faces the image sensing unit, a portion of the thermoelectric element adjacent to an upper portion of the lens unit being heated and another portion of the thermoelectric element adjacent to the image sensing unit being cooled;

wherein the holder comprises:

a lens coupling unit coupled to a lower portion of the lens unit;

a first support part supporting a lower portion of the thermoelectric element; and a second support part supporting a side portion of the thermoelectric element;

wherein the holder comprises:

a lens coupling unit coupled to a low portion of the lens unit;

a first support part supporting a lower portion of the thermoelectric element; and a second support part supporting a side portion of the thermoelectric element;

wherein a pattern electrode conductively connected to the thermoelectric element is formed on a lower surface of the cover member; and wherein a pair of through holes is formed through the second support part such that a pair of cables is inserted into the pair of through holes.

* * * * *